United States Patent
Yamasaki et al.

(10) Patent No.: US 8,029,621 B2
(45) Date of Patent: Oct. 4, 2011

(54) RAW MATERIAL FEEDING DEVICE, FILM FORMATION SYSTEM AND METHOD FOR FEEDING GASEOUS RAW MATERIAL

(75) Inventors: Hideaki Yamasaki, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 667 days.

(21) Appl. No.: 12/067,714

(22) PCT Filed: Jul. 25, 2006

(86) PCT No.: PCT/JP2006/314611
§ 371 (c)(1),
(2), (4) Date: Mar. 21, 2008

(87) PCT Pub. No.: WO2007/034623
PCT Pub. Date: Mar. 29, 2007

(65) Prior Publication Data
US 2009/0250006 A1   Oct. 8, 2009

(30) Foreign Application Priority Data
Sep. 21, 2005 (JP) .................................. 2005-274470

(51) Int. Cl.
*C23C 16/00* (2006.01)
(52) U.S. Cl. .................................. 118/726; 427/248.1
(58) Field of Classification Search .................. 118/726; 427/248.1
See application file for complete search history.

(56) References Cited

U.S. PATENT DOCUMENTS

| 3,925,146 A * | 12/1975 | Olsen et al. ..................... 117/86 |
| 4,911,101 A | 3/1990 | Ballingall, III et al. |
| 2003/0101937 A1 * | 6/2003 | Van Slyke et al. ............ 118/726 |
| 2005/0011448 A1 * | 1/2005 | Iwata ............................ 118/715 |

FOREIGN PATENT DOCUMENTS

| JP | 63 297295 | 12/1988 |
| JP | 5-311446 | 11/1993 |
| JP | 8 167575 | 6/1996 |
| JP | 2004 140328 | 5/2004 |

* cited by examiner

*Primary Examiner* — Parviz Hassanzadeh
*Assistant Examiner* — Keath Chen
(74) *Attorney, Agent, or Firm* — Oblon, Spivak, McClelland, Maier & Neustadt, L.L.P.

(57) ABSTRACT

A raw material feeding device for feeding a gaseous raw material formed by sublimating a solid raw material to a film formation system includes a raw material container for holding the solid raw material therein, a first heating unit placed at a first side of the container, a second heating unit placed at a second side thereof, the first temperature control unit for conducting a first process of controlling the first and the second heating unit to make the temperature of the first side higher than that of the second side to thereby sublimate the solid raw material disposed at the first side, and the second temperature control unit for conducting a second process of controlling the first and the second heating unit to make the temperature of the second side higher than that of the first side to thereby sublimate the solid raw material disposed at the second side.

1 Claim, 10 Drawing Sheets

CONDITION 1

| | FIRST TEMP. TREATMENT | SECOND TEMP. TREATMENT | FILM FORMATION |
|---|---|---|---|
| HEATER 203 | 15.0 | 70.0 | 45.0 |
| HEATER 204 | 20.0 | 20.0 | 40.0 |
| HEATER 202 | 60.0 | 20.0 | 40.0 |
| TIME | 9.5h | 5h | 3.5h |

CONDITION 2

| | FIRST TEMP. TREATMENT | SECOND TEMP. TREATMENT | FILM FORMATION |
|---|---|---|---|
| HEATER 203 | 20.0 | 80.0 | 45.0 |
| HEATER 204 | 20.0 | 20.0 | 40.0 |
| HEATER 202 | 70.0 | 20.0 | 40.0 |
| TIME | 5h | 5h | 2h |

FIG.2B

CONDITION 1

|  | FIRST TEMP. TREATMENT | SECOND TEMP. TREATMENT |
|---|---|---|
| HEATER 203 | 54.0 | 70.0 |
| HEATER 204 | 54.0 | 51.5 |
| HEATER 202 | 60.0 | 51.5 |
| TIME | 9.5h | 5h |

CONDITION 2

|  | FIRST TEMP. TREATMENT | SECOND TEMP. TREATMENT |
|---|---|---|
| HEATER 203 | 60.0 | 80.0 |
| HEATER 204 | 60.0 | 57.0 |
| HEATER 202 | 70.0 | 57.0 |
| TIME | 5h | 5h |

RAW MATERIAL FEEDING DEVICE, FILM FORMATION SYSTEM AND METHOD FOR FEEDING GASEOUS RAW MATERIAL

FIELD OF THE INVENTION

The present invention relates to a raw material feeding device for feeding a gaseous raw material formed by sublimation of a solid raw material into a film formation system, the film formation system using the raw material feeding device and a method for feeding the gaseous raw material.

BACKGROUND OF THE INVENTION

Recently, there has been used a method (e.g., a MOCVD (Metal-Organic Chemical Vapour Deposition) method) for forming a film on a target substrate by using, e.g., a metal-organic raw material gas. Many of the metal-organic raw material gases are in a solid state at normal temperature and pressure.

In order to use the solid raw material for the film formation, the solid raw material needs to be sublimated and supplied to a film formation system. The solid raw material is sublimated by, e.g., heating and then, the sublimed raw material is supplied to the film formation system together with a carrier gas.
Patent Document 1: Japanese Patent Laid-open Application No. 2004-140328

However, most of solid raw materials are of powder forms having particles of different diameters. Thus, when convection is caused by heating, or when a carrier gas is used, the solid raw materials in the form of powders, especially those having small particle diameters, may be blown away to be supplied to the film formation system.

If the particles are supplied to the film formation system, they may be incorporated into a film during film formation and also may deteriorate quality of the film formation, e.g., a production yield of semiconductor devices or the like.

SUMMARY OF THE INVENTION

In view of the above, the present invention provides a new and effective raw material feeding device and a film formation system using same.

A specific object of the present invention is to provide a raw material feeding device for feeding a gaseous raw material formed by sublimation of a solid raw material to a film formation system, thereby suppressing a generation of particles and the film formation system using the raw material feeding device.

In accordance with an aspect of the present invention, there is provided a raw material feeding device for feeding a gaseous raw material formed by sublimating a solid raw material to a film formation system, the raw material feeding device includes: a raw material container for holding the solid raw material therein; a first heating unit placed at a first side of the container; a second heating unit placed at a second side thereof; a first temperature control unit for conducting a first process of controlling the first and the second heating unit to make the temperature of the first side higher than that of the second side to thereby sublimate the solid raw material disposed at the first side; and a second temperature control unit for conducting a second process of controlling the first and the second heating unit to make the temperature of the second side higher than that of the first side to thereby sublimate the solid raw material disposed at the second side.

In accordance with another aspect of the present invention, there is provided a film formation system including: a processing vessel having therein a target substrate; and a raw material feeding device for feeding to the processing vessel a gaseous raw material to be used in film formation on the substrate, the gaseous raw material being produced by sublimating a solid raw material, wherein the raw material feeding device includes: a raw material container for holding the solid raw material therein; a first heating unit placed at a first side of the container; a second heating unit placed at a second side thereof; a first temperature control unit for conducting a first process of controlling the first and the second heating unit to make the temperature of the first side higher than that of the second side to thereby sublimate the solid raw material disposed at the first side; and a second temperature control unit for conducting a second process of controlling the first and the second heating unit to make the temperature of the second side higher than that of the first side to thereby sublimate the solid raw material disposed at the second side.

EFFECTS OF THE INVENTION

In accordance with the present invention, there can be provided a raw material feeding device for feeding a gaseous raw material formed by sublimation of a solid raw material to a film formation system wherein generation of particles is suppressed and a film formation system using the raw material feeding device.

DESCRIPTION OF REFERENCE CHARACTERS

200: raw material feeding device
201: raw material container
201a, 201b: particles
201A: solid raw material
205: raw material supplement unit
206, 207: gas lines
206A, 207A, 205A: valves 208: porous plate
301: interface
302, 303, 304: temperature control units
300: film formation system
300A: control device
300a: CPU
101, 102: processing vessels
103: exhaust port
104: substrate supporting table
106: pin installation table
107: upthrust pin
108: opening
109: shower head
109A: diffusion region
109B: supply port
110: gas hole
111: channel
112: coolant supply source
113: power supply
114: gas exhaust unit
115: movable equipment
116: gate valve
120, 130: gas lines
121, 131: purge lines
120A, 120C, 121A, 121C, 131A, 131C, 130C: valves
120B, 121B, 131B, 130B: mass flow controllers
130A: flowmeter
120D: raw material gas supply source
121D, 131D: purge gas supply sources

DETAILED DESCRIPTION OF THE EMBODIMENT

The embodiments of the present invention will be described with reference to the accompanying drawings.

First Embodiment

Figure 1A:
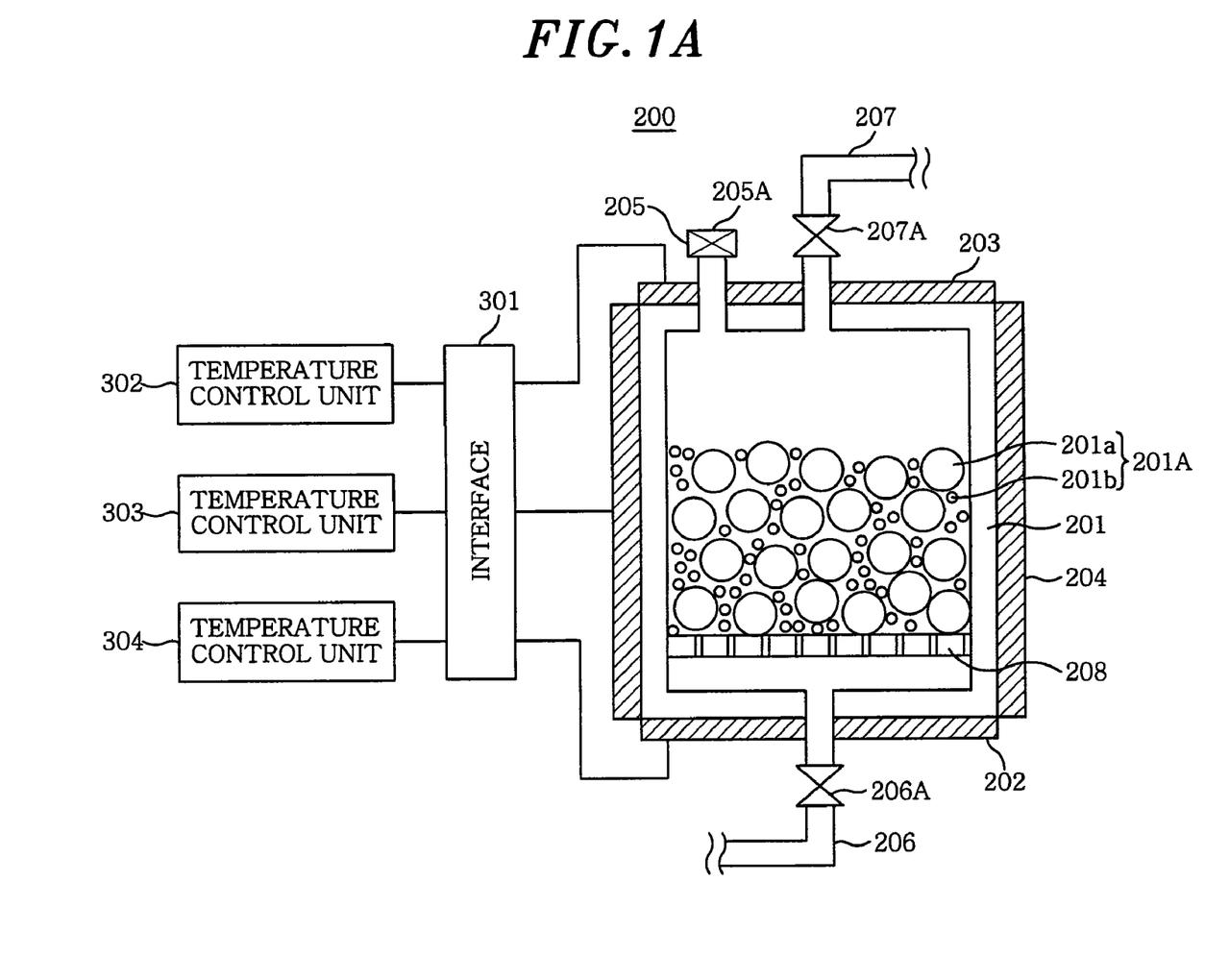
FIG. 1A is a first schematic view of a raw material feeding device in accordance with a first embodiment of the present invention.

FIG. 1A is a schematic cross sectional view of a raw material feeding device 200 in accordance with a first embodiment of the present invention. Referring to FIG. 1A, the raw material feeding device 200 includes, e.g., a substantially cylindrical raw material container 201 holding therein a solid raw material 201A. A heater 202 is installed outside of a bottom surface of the cylindrical raw material container 201, and a heater 203 is installed outside of an opposing top surface thereof. Further, a heater 204 is installed on the side surface (circumferential surface) of the cylindrical raw material container 201 to cover same. These heaters are constructed to heat and sublimate the solid raw material 201A.

Moreover, a gas line 206 having a valve 206A for supplying a carrier gas to the raw material container 201 is connected to the bottom surface of the raw material container 201. Inside the raw material container 201, the solid raw material 201A is contained, and a porous plate 208 is installed near the side where the gas line 206 is installed. Further, the carrier gas supplied through the gas line 206 is uniformly supplied into the raw material container 201 via holes formed in the porous plate 208.

The raw material sublimed by being heated by the heaters is supplied to a film formation system (not shown in FIG. 1A.) via a gas line 207 having a valve 207A, the gas line 207 being installed at a side opposite to where the gas line 206 of the raw material container 201 is installed.

In addition, a raw material supplement unit 205 is installed adjacent to the gas line 207, so that a solid raw material can be supplied from the raw material supplement unit 205 to the raw material container 201 by opening a valve 205A.

In order to supply a gaseous raw material to, e.g., a film formation system or the like, by using the raw material feeding device 200 of this embodiment, a gaseous raw material is produced by heating and sublimating the solid raw material 201A by using the heaters 202, 203 and 204. Next, a carrier gas, e.g., Ar or the like, is supplied to the raw material container 201 by opening the valves 206A and 207A. Thereafter, the gaseous raw material is supplied to the film formation system together with the carrier gas via the gas line 207.

A conventional raw material feeding device has a drawback in that a solid raw material in the form of powder is swirled up (blown away) and flow into the film formation system in the form of particles. Generally, the solid raw material is made up of particles having various particle diameters. In FIG. 1A to 1D, among particles forming the solid raw material 201A, those having a large particle diameter (greater than, e.g., 1.5 mm) are indicated as 201a, and those having a small particle diameter (smaller than or equal to, e.g., 1.5 mm) are indicated as 201b. However, such example is for illustration. In fact, the raw material 201A has various particle diameters.

In the raw material feeding device 200 of this embodiment, the gaseous raw material is formed by actively sublimating the solid raw material having particles of small diameters (particles 201b), and then the gaseous raw materials are solidified and attached to the solid raw material having particles of large diameters (particles 201a) so that crystal grains thereof are made to grow.

Accordingly, among the solid raw material 201A, particles having a small particle diameter are removed, thereby suppressing the generation of particles during the raw material feeding operation.

Therefore, the raw material feeding device 200 of this embodiment is constructed so that a temperature treatment can be executed under different temperature conditions by setting the heaters 202, 203 and 204 to proper temperatures.

To be specific, the raw material feeding device 200 has a first temperature control unit 302 for controlling the heaters to set a temperature of the raw material container 201 to a first temperature (temperature distribution) for performing a first temperature treatment, a second temperature control unit 303 for controlling the heaters to set a temperature of the raw material container 201 to a second temperature (temperature distribution) for performing a second temperature treatment, and a third temperature control unit 304 for controlling the heaters to set a temperature of the raw material container 201 to a temperature (temperature distribution) for feeding a raw material for film formation.

The first to the third temperature control unit 302, 303 and 304 are connected to the heaters 202, 203 and 204 via an interface 301.

In the above raw material feeding device 200, the first temperature control and the second temperature control are performed in that order. Accordingly, among the solid raw material, particles having a small particle size can be removed (changed into a part of particles having a large particle size). Next, the temperature of the raw material container is set to a temperature for feeding a raw material. As a result, the raw material can be stably supplied to the film formation system while suppressing the generation of particles.

Hereinafter, the first and the second temperature treatment will be described in detail.

Figure 1B:
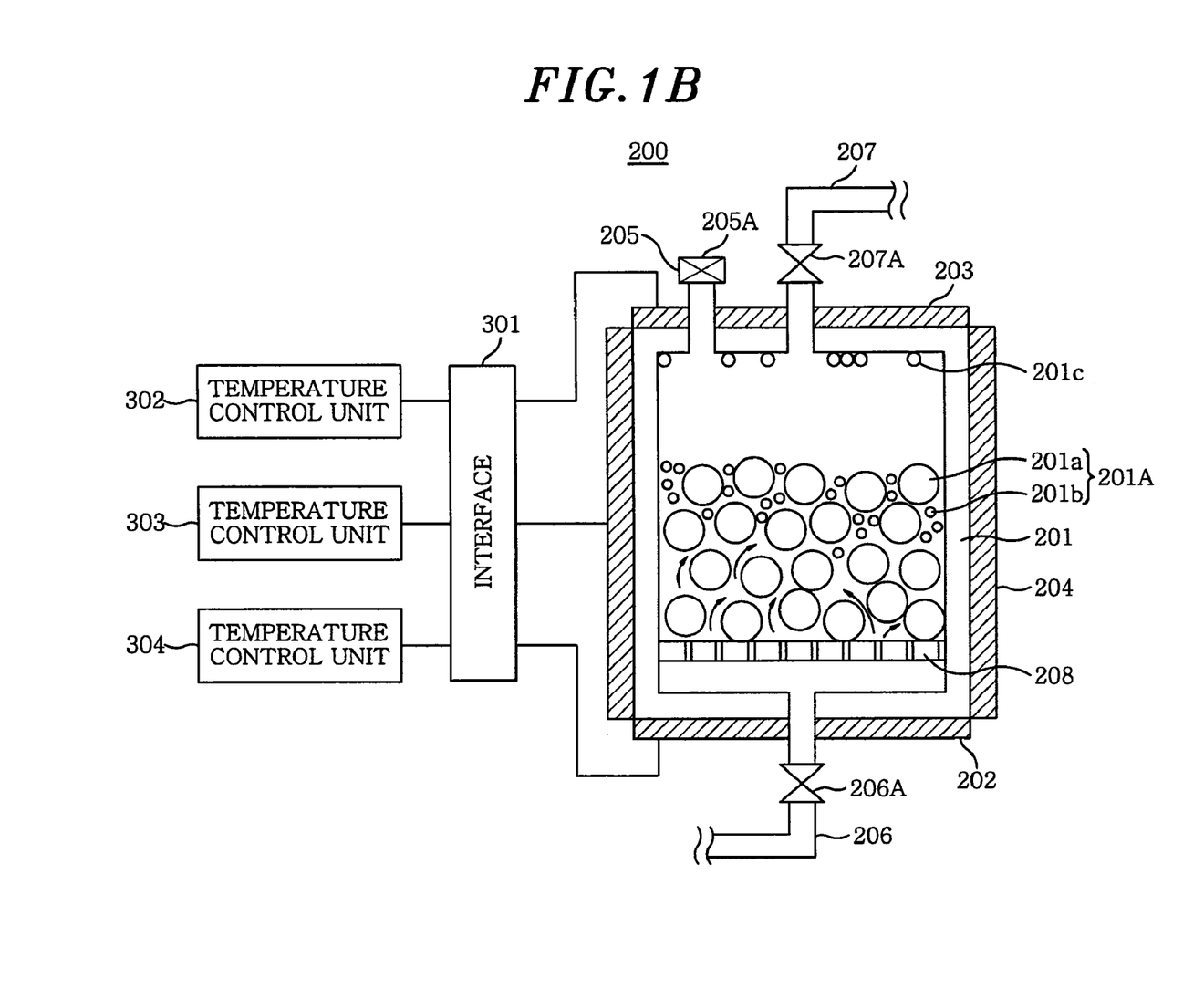
FIG. 1B shows a second schematic view of the raw material feeding device in accordance with the first embodiment of the present invention.
Figure 1C:
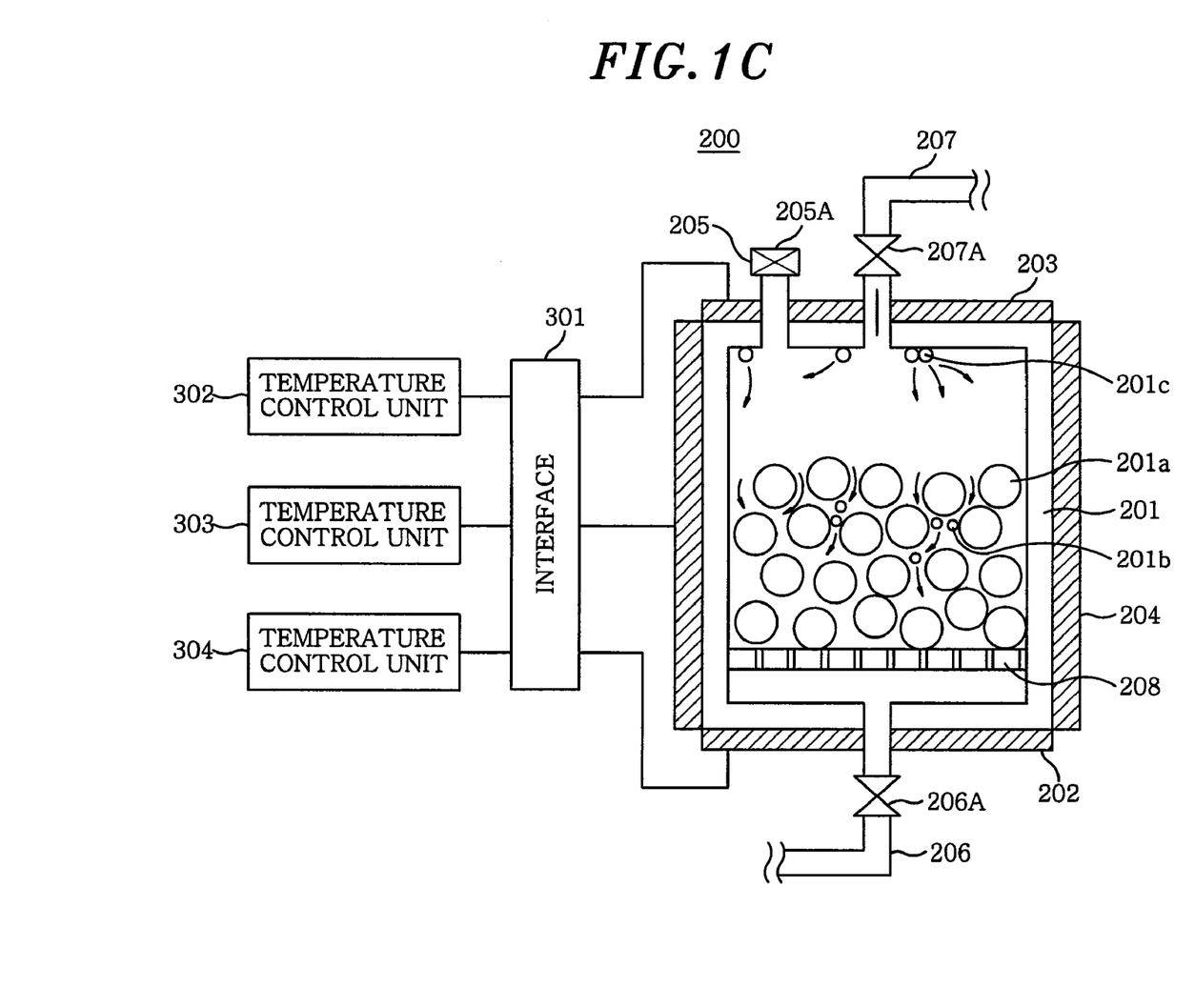
FIG. 1C shows a third schematic view of the raw material feeding device in accordance with the first embodiment of the present invention.
Figure 1D:
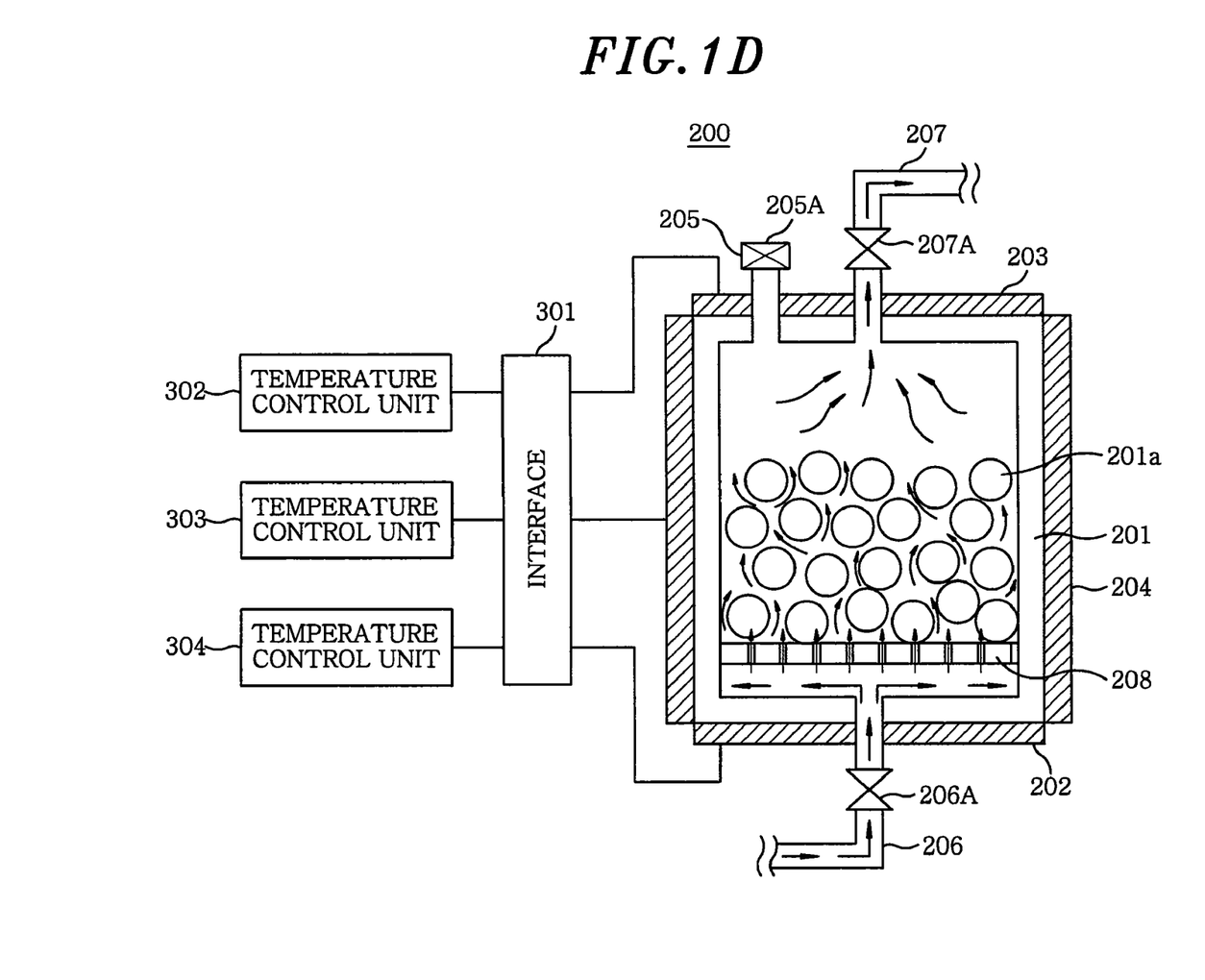
FIG. 1D shows a fourth schematic view of the raw material feeding device in accordance with the first embodiment of the present invention.

FIGS. 1B to 1D illustrate states of feeding a raw material by the raw material feeding device 200 in the first and the second temperature treatment and the film formation, respectively.

Like reference numerals will be used for like parts identical or similar to those described in the above, and redundant description thereof will be omitted.

To begin with, in the first temperature treatment described in FIG. 1B, the temperatures of the heaters 202, 203 and 204 are controlled by the first temperature control unit 302. In this case, the temperature of the heater 202 is set higher than those of the heaters 203 and 204.

Here, the raw material 201A is sublimated at an inner side of the raw material container 201 where the heater 202 is installed (hereinafter, referred to as "lower side"). The raw material is easily sublimated in the case when particles are of a smaller particle diameter. This is because a ratio of a surface area of the solid raw material to a volume thereof is large. Referring to the drawings, between the particles 201a and 201b, mainly the particles 201b are sublimated.

Namely, in the first temperature treatment, the gaseous raw material is formed by actively sublimating the solid raw material primarily made up of fine particles in the lower side and then the gaseous raw material is solidified at the side where the heater 203 of a low temperature is installed (hereinafter, referred to as "upper side") to thereby make the particles 201c grow or the crystal grains in the upper side, e.g., the particles 201a grow.

Next, in the second temperature treatment shown in FIG. 1C, the temperatures of the heaters 202, 203 and 204 are controlled by the second temperature control unit 303. In this case, the temperature of the heater 203 is set higher than those of the heaters 202 and 204.

Here, the raw material 201A is sublimated at the upper side of the inside of the raw material container 201. As set forth above, the raw material can easily be sublimated in the case when particles are of a smaller particle diameter. Therefore, the gaseous raw material is formed by actively sublimating the solid raw material 201b made up of fine particles remaining in the upper side and the solid raw material 201c solidified by the first temperature treatment, thereby letting the crystal grains, e.g., the particles 201a, grow in the lower side where the temperature is low.

As a result of the first and the second temperature treatment, a high temperature portion and a low temperature portion are alternately generated in the raw material container. Accordingly, the sublimed raw material is solidified at the low temperature portion, and a pressure in the raw material container decreases. For these reasons, the amount of the solid raw material having a small particle diameter can be reduced continuously without saturation of the raw material gas in the raw material container.

If the same portion (the upper portion or the lower portion) is heated continuously, the particles grow excessively, and the efficiency of feeding the raw material becomes poor as will be described later. However, in this embodiment in which the upper side and the lower side are alternately set to the high temperature portion and the lower temperature portion, the particles 201a grow properly and, hence, the raw material can be stably supplied.

FIG. 1D shows a state of feeding the gaseous raw material formed by sublimation of the solid raw material to the film formation system (not illustrated) after performing the first and the second temperature treatment.

Referring to the state depicted in FIG. 1D, the temperatures of the heaters 202, 203 and 204 are controlled by the third temperature control unit 304. In this case, the temperatures of the heaters 202, 203 and 204 are controlled to a level at which the solid raw material 201A can be effectively sublimated.

In addition, the carrier gas is supplied to the raw material container 201 by opening the valves 206A and 207A. The gaseous raw material formed by sublimation in the raw material container 201 is supplied to the film formation system together with the carrier gas via the gas line 207. In this case, the amount of the solid raw material having a small particle diameter has been decreased by the first and the second temperature treatment. Therefore, the generation of particles is suppressed, and a pure gaseous raw material can be stably supplied to the film formation system.

In the raw material feeding device of this embodiment, various solid raw materials can be sublimated and supplied to the film formation system. Although a metal-organic raw material or the like is a typical example thereof, this embodiment can be applied to the supply of various raw materials other than the metal-organic raw material.

Figure 2A:
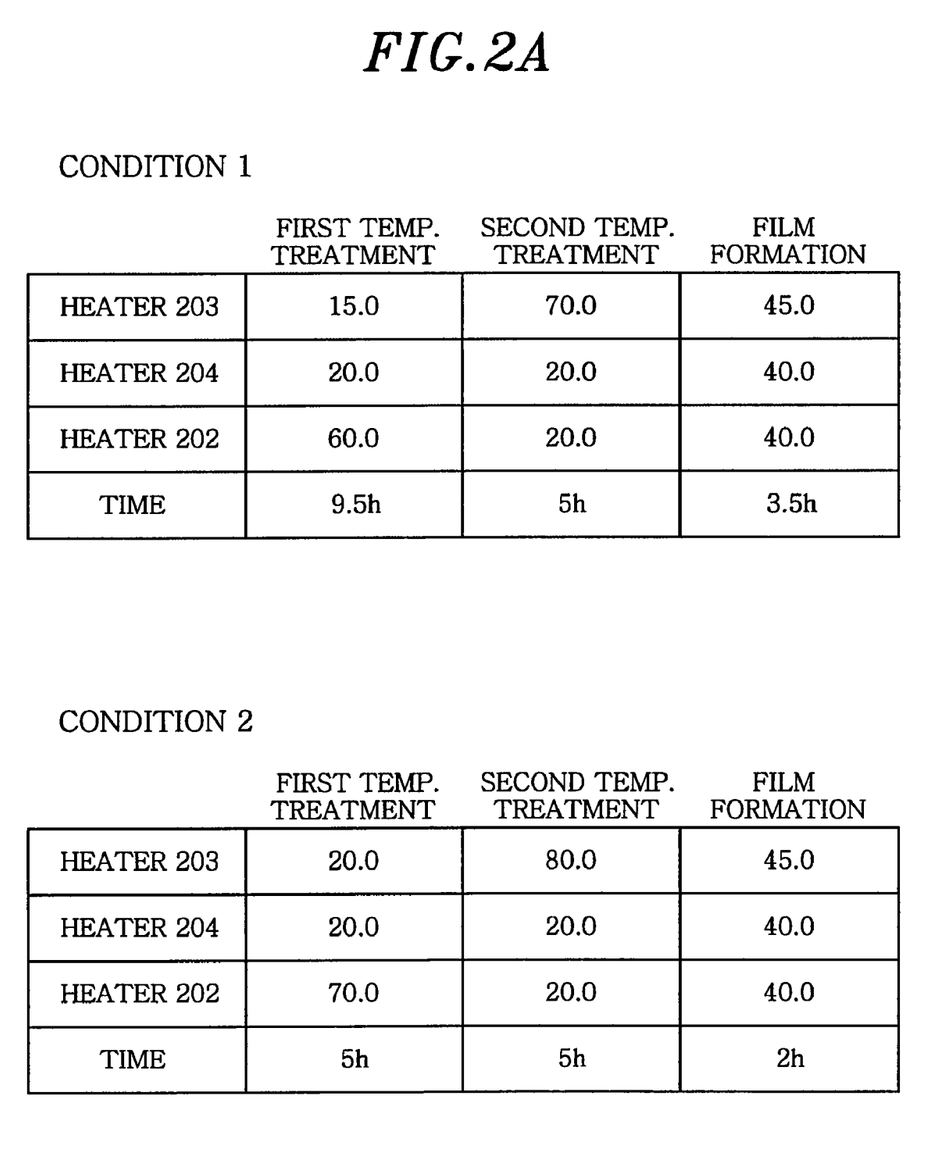
FIG. 2A illustrates a first example of a temperature control in the raw material feeding device.
Figure 2B:
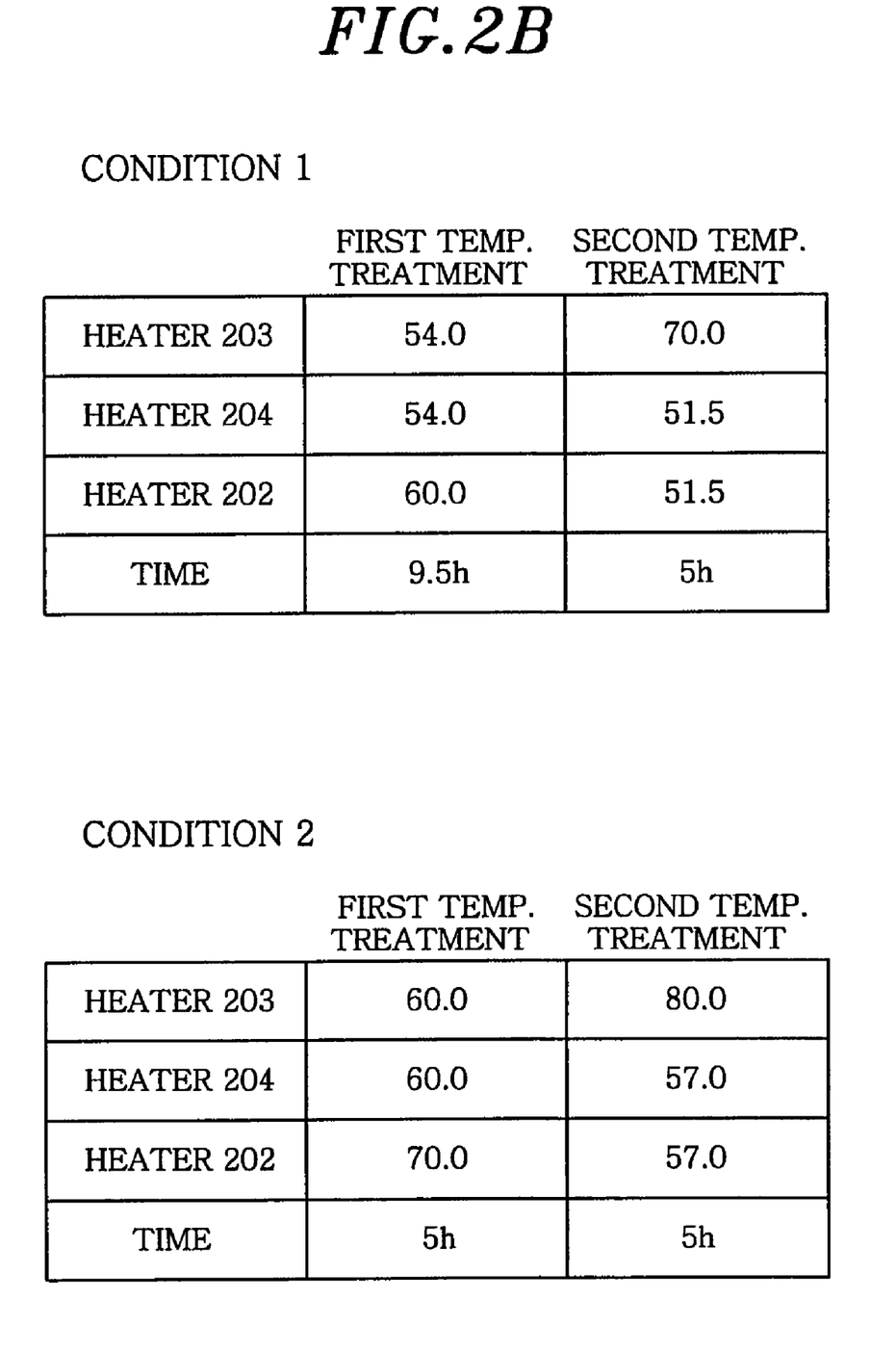
FIG. 2B illustrates a second example of the temperature control in the raw material feeding device.

FIGS. 2A and 2B provide examples of temperature control in the case of feeding $W(CO)_6$ as an example of the metal-organic raw material by using the raw material feeding device 200. Referring to FIGS. 2A and 2B, there are illustrated two conditions (condition 1 and condition 2). FIG. 2A shows temperature setting values of the heaters 202, 203 and 204 and processing time in the first and the second temperature treatment under both conditions. FIG. 2B depicts actually measured temperatures of the heaters 202, 203 and 204 and processing time in the first and the second temperature treatment under both conditions. Besides, FIG. 2A describes temperature setting values of the heaters 202, 203 and 204 in the case of feeding the raw material to the film formation system and preparation time at each temperature that is required until the film formation starts (time required to stabilize the sublimation).

Referring to FIGS. 2A and 2B, in the first temperature treatment performed under the condition 1, the temperatures of the heaters 203, 204 and 202 were set to 15° C., 20° C. and 60° C., respectively. The actual temperatures of the heaters 203, 204 and 202 were observed to be 54° C., 54° C. and 60° C., respectively. The first temperature treatment was performed for 9.5 hours.

In the second temperature treatment, the temperatures of the heaters 203, 204 and 202 were set to 70° C., 20° C. and 20° C., respectively. The actual temperatures of the heaters 203, 204 and 202 were observed to be 70° C., 51.5° C. and 51.5° C., respectively. The second temperature treatment was performed for 5 hours.

In the case of feeding the raw material to the film formation system, the temperatures of the heaters 203, 204 and 202 were set to 45° C., 40° C. and 40° C., respectively. The actual temperatures thereof were observed to be the same. The preparation time in each temperature that was required until the start of the film formation operation (time required to stabilize the sublimation) was 3.5 hours.

In the same manner, in the first temperature treatment performed under the condition 2, the temperatures of the heaters 203, 204 and 202 were set to 20° C., 20° C. and 70° C., respectively. The actual temperatures of the heaters 203, 204 and 202 were observed to be 60° C., 60° C. and 70° C., respectively. Further, the first temperature treatment was performed for 5 hours.

In the second temperature treatment, the temperatures of the heaters 203, 204 and 202 were set to 80° C., 20° C. and 20° C., respectively. The actual temperatures of the heaters 203, 204 and 202 were observed to be 80° C., 57° C. and 57° C., respectively. Further, the second temperature treatment was performed for 5 hours.

In the case of feeding the raw material to the film formation system, the temperatures of the heaters 203, 204 and 202 were set to 45° C., 40° C. and 40° C., respectively. The actual temperatures thereof were observed to be the same. Moreover, the preparation time in each temperature that was required until the start of the film formation operation (time required to stabilize the sublimation) was 2 hours.

In any of the conditions 1 and 2, the generation of particles can be suppressed during the raw material supply. Meanwhile, under the condition 2, the temperatures are set higher, and especially the temperature of the high temperature side is set higher, but the processing time is short.

The reason that the processing time under the condition 2 is short is that the process is effectively performed by increasing the temperature of the high temperature side. Therefore, under the condition 2, the processing time is short, and the preparation time required until the film formation starts is also short.

However, if the processing temperature (especially, the temperature of the high temperature side) is set too high, the particles of the solid raw material may grow excessively. To that end, it is preferable to set the processing temperature to a proper level.

Figure 3A:
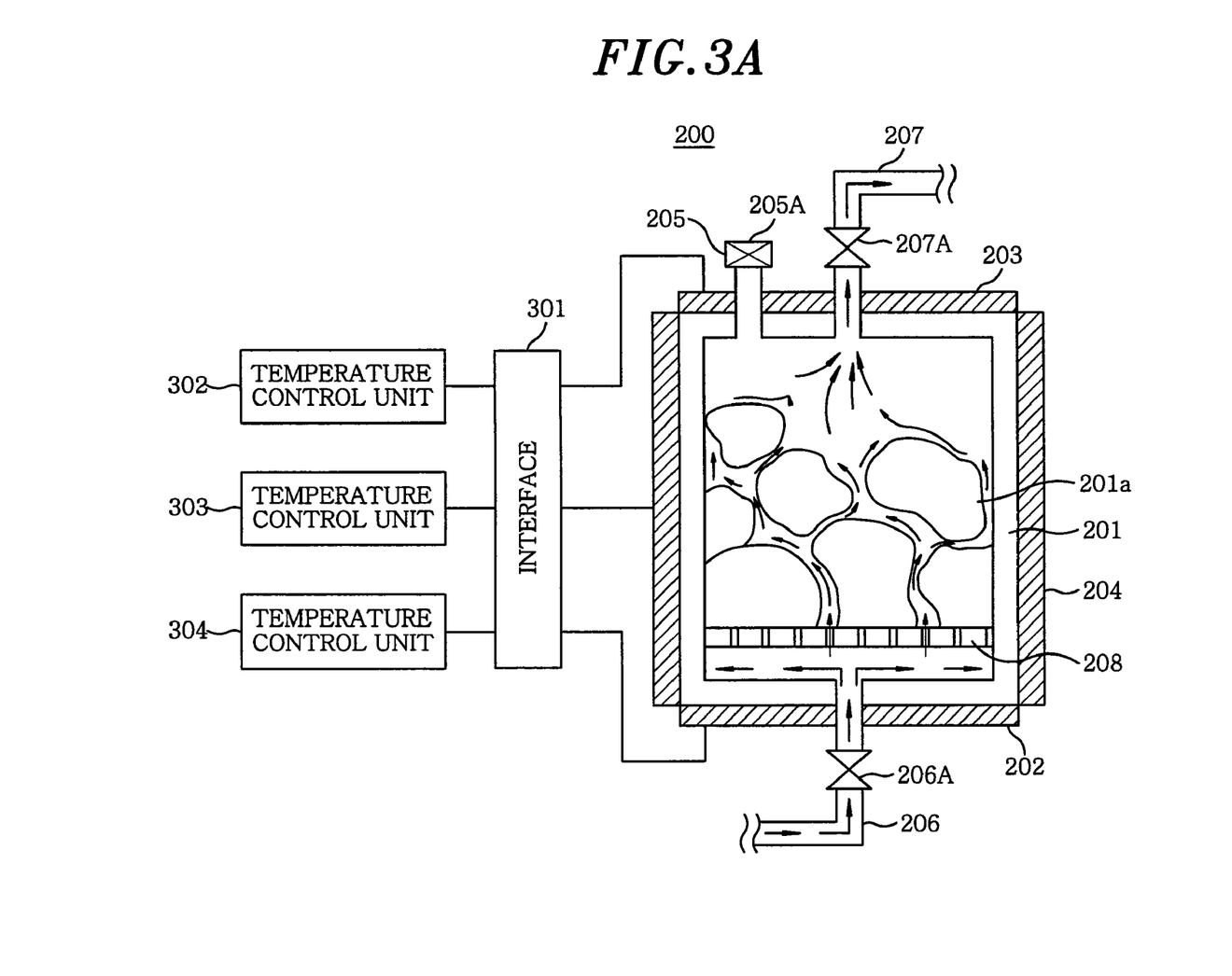
FIG. 3A provides a first schematic view showing a state where particles of a solid raw material are overgrown.
Figure 3B:
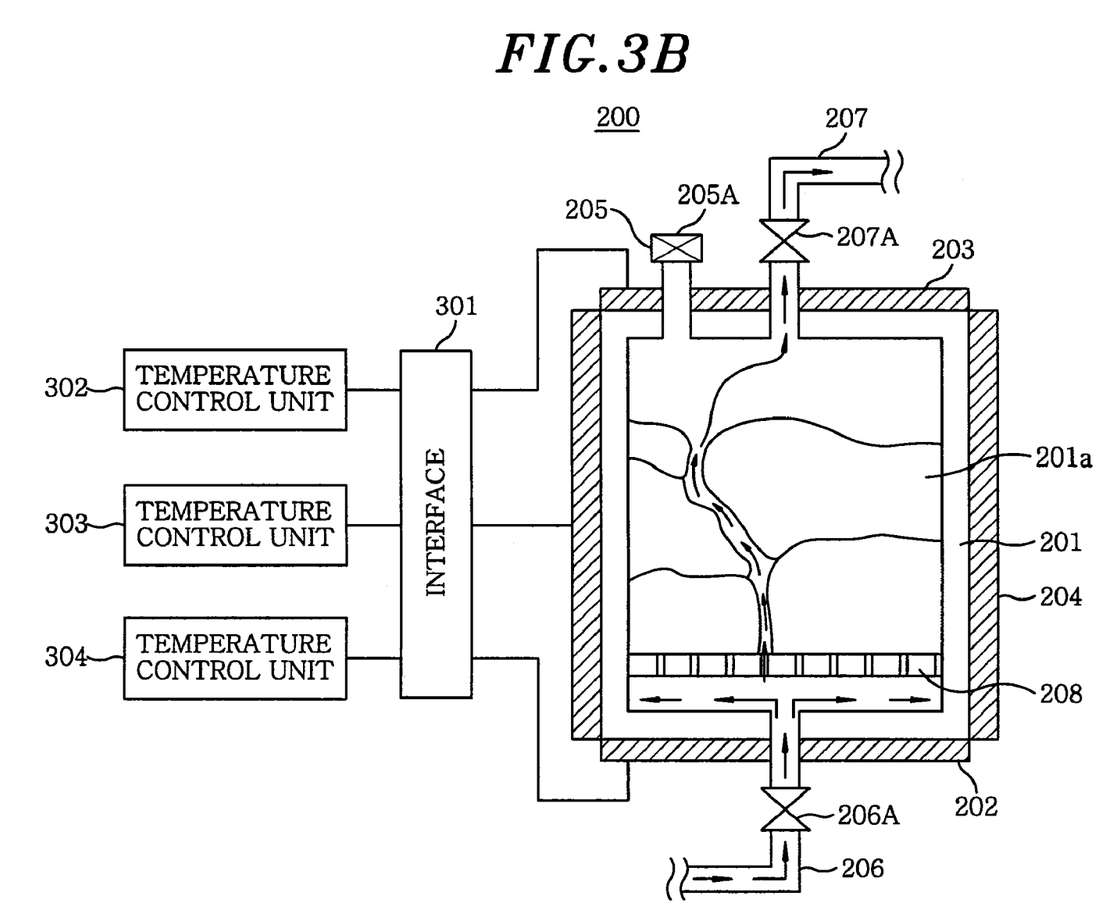
FIG. 3B provides a second schematic view describing a state where particles of a solid raw material are overgrown.

FIGS. 3A and 3B schematically depict the states where the particles of the solid raw material are overgrown due to an excessively high processing temperature or excessively long processing time, for example. Like reference numerals will be used for like parts identical or similar to those described in the above, and redundant description thereof will be omitted.

FIG. 3A describes a state in which particles become larger by the growth of the particles of the solid raw material while the entire surface area of the solid raw material becomes smaller. As a consequence, the efficiency of the sublimation of the solid raw material becomes deteriorated, and the efficiency of the gaseous raw material supply becomes poor.

FIG. 3B shows a state in which particles have grown more than those in the state of FIG. 3A. In the state illustrated in FIG. 3B, the gaseous raw material formed by the sublimation of the solid raw material is supplied through a substantially single passage, thereby further reducing the efficiency of feeding the gaseous raw material.

In order to prevent the overgrowth of the particles and effectively sublimate the raw material, it is preferable to set the temperature of the heater at the high temperature side within a proper range during the first and the second temperature treatment. For example, the temperature of the heater 202 in the first temperature treatment and that of the heater 203 in the second temperature treatment preferably set to range from 50% to 95% of a decomposition starting temperature of the solid raw material.

Further, in order to stably sublimate the solid raw material, it is preferable to control the temperature of the high temperature side (the temperature of the heater 202 in the first temperature treatment and that of the heater 203 in the second temperature treatment) so that a vapor pressure of the solid raw material becomes greater than or equal to 0.05 Torr and smaller than or equal to 10 Torr, and more preferably greater than or equal to 0.1 Torr and smaller than or equal to 5 Torr.

In the first and the second temperature treatment, if the temperature at the heater at the low temperature side is too high, it is difficult to solidify the raw material. On the contrary, if it is too low, it is difficult to sublimate the raw material at the high temperature side. Therefore, it is preferable to set the temperature within a proper range.

Accordingly, the temperature of the heater 203 in the first temperature treatment and that of the heater 202 in the second temperature treatment are preferably set to be lower by a temperature within a range from 5° C. to 20° C. than the high temperature portion in each treatment (temperature of the heater at the high temperature side).

In this embodiment, the heater 204 can be omitted. In that case, the temperatures for the first and the second temperature treatment and the film formation are maintained by the heaters 202 and 203. However, the structure in which the heater 204 is added provides the effects of decreasing the temperature treatment time and the time required to stabilize the temperature.

Moreover, in this embodiment, the solid raw material having a particle diameter smaller than or equal to 1.5 mm is mainly removed (sublimated so as to become particles having a large particle diameter), to thereby reduce the amount of particles in the gaseous solid material.

Figure 4A:
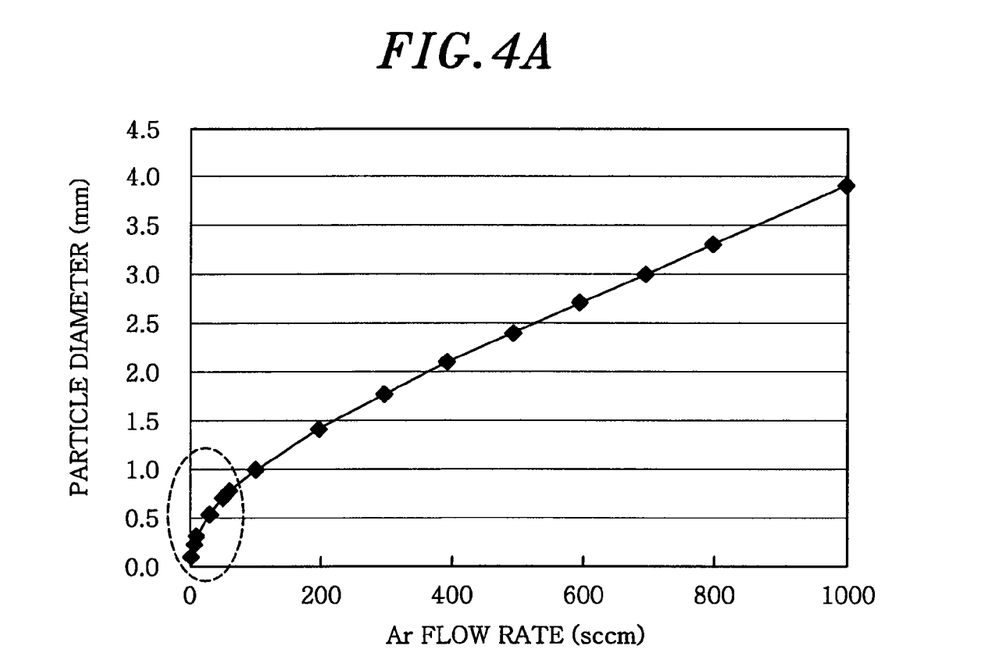
FIG. 4A depicts a relationship obtained by simulation between a flow rate of a carrier gas and a particle diameter of a swirled up solid raw material.
Figure 4B:
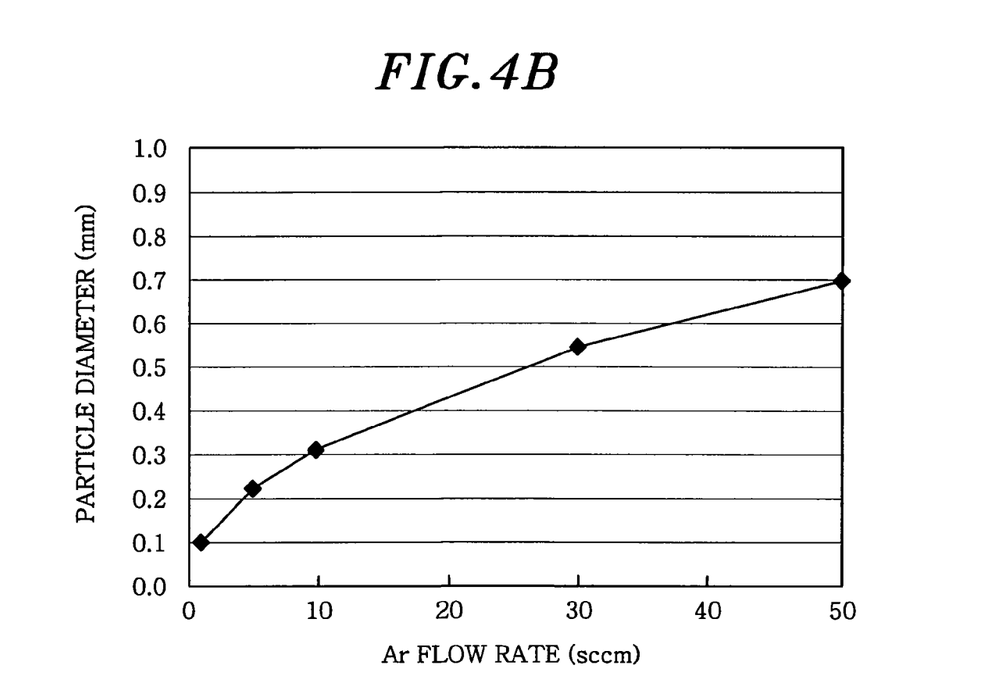
FIG. 4B depicts a relationship obtained by simulation between a flow rate of a carrier gas and a particle diameter of the swirled up solid raw material.

FIG. 4A depicts a relationship obtained by simulation between a flow rate of a carrier gas and a particle diameter of a swirled up solid raw material in the raw material feeding device. FIG. 4B is an enlarged view of FIG. 4A (carrier gas having a flow rate of 0 sccm to 50 sccm).

Referring to FIGS. 4A and 4B, as the flow rate of the carrier gas increases, the particle diameter of the swirled up solid raw material becomes larger. In general, a flow rate of a carrier gas used for film formation is smaller than or equal to 200 sccm, and a particle diameter of a solid raw material swirled up within a range of the flow rate of the carrier gas is smaller than or equal to 1.5 mm. Namely, in the raw material feeding device of this embodiment, the particles having a particle diameter smaller than or equal to 1.5 mm are mainly removed. Especially the particles having a particle diameter smaller than or equal to 50 μm among those having a particle diameter smaller than or equal to 1.5 mm easily becomes particles, thus by eliminating the solid raw material having a small particle diameter, the effects of suppressing particles can be enhanced.

Second Embodiment

Hereinafter, a film formation system 300 as an example of a film formation system using the raw material feeding device 200 in accordance with the first embodiment of the present invention will be described with reference to FIG. 5. Like reference numerals will be used for like parts identical or similar to those described in the above, and redundant description thereof will be omitted.

Figure 5:
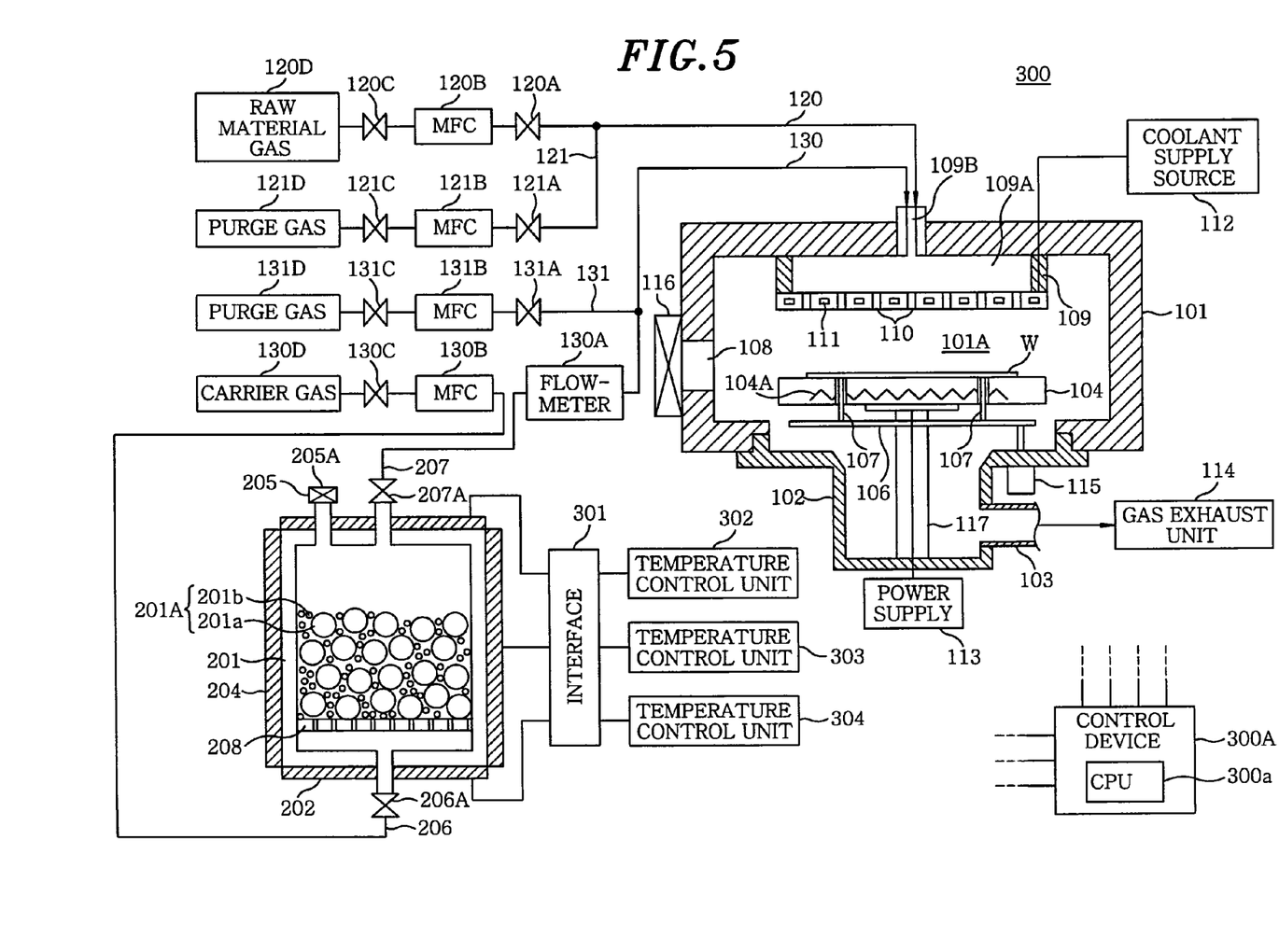
FIG. 5 describes a film formation system in accordance with a second embodiment of the present invention.

As shown in FIG. 5, the film formation system 300 of this embodiment includes: a housing-shaped processing vessel 101 having an opening at a bottom portion thereof; a cylindrical processing vessel 102 protruded downwardly from the opening; and an inner space 101A partitioned by the processing vessels 101 and 102.

The inner space 101A is constructed so that it can be exhausted and depressurized by a gas exhaust unit 114, e.g., a vacuum pump or the like, through an exhaust port 103 installed at the processing vessel 102.

Further, a cylindrical support 117 is installed upright on the bottom portion of the processing chamber 102, and a substantially circular plate-shaped substrate supporting table 104 is installed on the support 117. A heater 104A connected to a power supply 113 is buried in the substrate supporting table 104, thereby heating a target substrate W supported on the substrate supporting table 104.

Moreover, the target substrate W supported on the substrate supporting table 104 has a structure in which it is raised by an upthrust pin 107 installed to penetrate the substrate supporting table 104. The upthrust pin 107 is installed on a pin installation table 106 attached on a circular plate-shaped, and is raised or lowered by a vertical movement of the pin installation table 106 by a movable equipment 115.

For example, the vertical movement of the upthrust pin 107 is carried out when the target substrate W is unloaded from the processing vessel 101 to the outside or when the target substrate W that has been unloaded to the outside is loaded onto the substrate supporting table 104.

An opening 108 to which a gate valve 116 is attached is formed on a sidewall of the processing vessel 101. Accordingly, by opening the gate valve 116, the target substrate W can be loaded and unloaded by using, e.g., an arm of a transfer robot.

Installed at the side facing the substrate supporting table 104 of the processing vessel 101 is a shower head 109 for supplying a gaseous raw material to the inner space 101A for forming a film on the target substrate W. The shower head 109 includes a supply port 109B for supplying a gaseous raw material or the like from the raw material feeding device 200 or the like, a diffusion region 109A for diffusing the gaseous raw material, and gas holes 110 for supplying the gaseous raw material to the inner space 101A.

Formed at the shower head 109 is a channel 111 where a coolant for cooling the shower head 109 flows. The coolant is supplied from a coolant supply source 112 to the channel 111.

Further, gas lines 120 and 130 are connected to the supply port 109B, so that two types of gaseous raw material (gas) can be supplied in this embodiment.

First of all, a raw material gas supply source 120D is installed in the gas line 120 via valves 120A and 120C and a mass flow controller 120B. By opening the valves 120A and 120C, a flow rate can be controlled by the mass flow controller 120B and, also, the raw material gas can be supplied to the inner space 101A.

Moreover, a purge line 121 is connected to the gas line 120. A purge gas supply source 121D is installed in the purge line 121 via valves 121A and 121C and a mass flow controller 121B. By opening the valves 121A and 121C, a flow rate can be controlled by the mass flow controller 121B and, also, the purge gas can be supplied to the inner space 101A.

Besides, the raw material feeding device 200 described in FIGS. 1A to 1D is connected to the gas line 130 via a flowmeter 130A. In this case, the gas line 207 is connected to the flowmeter 130A, and the gaseous raw material formed by sublimation is supplied to the inner space 101A via the gas line 130.

The gas line 206 is connected with a carrier gas supply source 130D via a mass flow controller 130B and a valve 130C. By opening the valve 130C, a flow rate can be controlled by the mass flow controller 130B and, also, a carrier gas can be supplied to the raw material feeding device 200.

In addition, a purge line 131 is connected to the gas line 130. A purge gas supply source 131D is installed in the purge line 131 via valves 131A and 131C and a mass flow controller 131B. By opening the valves 131A and 131C, a flow rate can be controlled by the mass flow controller 131B and, also, the purge gas can be supplied to the inner space 101A.

The operation of the film formation in the film formation system 300, e.g., the opening/closing of the valves, the flow rate control, the control of the heaters in the substrate supporting table, the vertical movement of the upthrust pin, the vacuum evacuation or the like, is controlled by a control device 300A having a CPU 300a. The illustration of connection wiring thereof is omitted.

The CPU 300a is connected with the first, the second and the third temperature control unit 302, 303 and 304 (connection wiring thereof are not illustrated), and the temperatures of the heaters in the temperature treatment of the raw material feeding device 200 are also collectively controlled by the control device 300A.

Or, the first and the second temperature treatment and the temperature control for feeding a raw material for film formation can be performed alternately based on instructions from the control device 300A by a single temperature control unit, instead of separately providing the first to the third temperature control unit 302 to 304.

In order to perform the film formation by the film formation system 300, the first and the second temperature treatment described in FIGS. 1B and 1C are carried out in the raw material feeding device 200. As a consequence, among the particle-shaped solid raw material, the solid raw material having a small particle diameter is removed. Next, the heaters 202, 203 and 204 are set to temperatures for film formation (temperatures at which the sublimation is activated so that the solid raw material for film formation can be supplied). After predetermined preparation time elapses, the gaseous raw material is supplied to the inner space 101A by using the carrier gas, as described in FIG. 1D.

The gaseous raw material supplied to the inner space 101A is decomposed on the target substrate W heated by the heater 104A to thereby form the film.

Hereinafter, a result of measuring the number of particles on the target substrate after performing the film formation by using the film formation system 300 will be described. Here, three cases were compared: test 1) a film formation was carried out without performing the temperature treatment described in FIGS. 1B and 1C; test 2) a film formation was carried out after performing the temperature treatment described in FIGS. 1B and 1C under the condition 1 of FIGS. 2A and 2B; test 3) a film formation was carried out after performing the temperature treatment described in FIGS. 1B and 1C under the condition 2 of FIGS. 2A and 2B.

The following conditions were applied to each of the tests. As for a solid raw material, $W(CO)_6$ in a powder state was used. As for a carrier gas, Ar having a flow rate of 90 sccm was used. As for a purge gas (dilution gas), Ar having a flow rate of 700 sccm was used. A pressure in the inner space 101A was 67 Pa. The film formation time was 75 seconds. In this state, a W (tungsten) film having a thickness of 10 nm was formed on the target substrate.

In each of the tests, the number of particles on the target substrate on which the film was formed was measured by a particle counter. As a result, the number of particles having a particle diameter greater than or equal to 0.1 μm was 252 in the test 1, 48 in the test 2 and 11 in the test 3. Further, the number of particles having a particle diameter greater than or equal to 0.5 μm was 143 in the test 1, 17 in the test 2 and zero in the test 3.

Namely, it is clear that the number of particles can be reduced by the film formation system using the raw material feeding device in accordance with this embodiment of the present invention.

In this embodiment, a metal-organic raw material was used as an example of a solid raw material. However, the present invention is not limited thereto, and can be applied to the case of sublimating various solid raw materials.

While the invention has been shown and described with respect to the embodiments, it will be understood by those skilled in the art that various changes and modification may be made without departing from the scope of the invention as defined in the following claims.

INDUSTRIAL APPLICABILITY

In accordance with the present invention, there can be provided a raw material feeding device for feeding a gaseous raw material formed by sublimation of a solid raw material to a film formation system and the film formation system using the raw material feeding device.

This international application claims the benefit of priority to Japanese Patent Application No. 2005-274470, filed on Sep. 21, 2005, the entire contents of which are incorporated herewith by reference.

What is claimed is:

1. A raw material feeding device for feeding a gaseous raw material formed by sublimating a solid raw material to a film formation system, comprising:
- a raw material container for holding the solid raw material therein;
- a first heating unit placed at a first side of the container;
- a second heating unit placed at a second side thereof; and
- a control device programmed with instructions to perform the following steps:
  - a first temperature control step for conducting a first process of controlling the first and the second heating unit to make the temperature of the first side higher than that of the second side to thereby sublimate the solid raw material disposed at the first side;
  - a second temperature control step for conducting a second process of controlling the first and the second heating unit to make the temperature of the second side higher than that of the first side to thereby sublimate the solid raw material disposed at the second side; and
  - a gaseous raw material feeding step for feeding the gaseous raw material formed by the sublimation of the solid raw material to the film formation system after performing the first temperature control step and the second temperature control step.

* * * * *